(12) United States Patent
Bardash

(10) Patent No.: US 11,469,273 B2
(45) Date of Patent: Oct. 11, 2022

(54) SOLID STATE TISSUE EQUIVALENT DETECTOR WITH SWITCHING COMPENSATION

(71) Applicant: Michael Bardash, Brooklyn, NY (US)

(72) Inventor: Michael Bardash, Brooklyn, NY (US)

( * ) Notice: Subject to any disclaimer, the term of this patent is extended or adjusted under 35 U.S.C. 154(b) by 0 days.

(21) Appl. No.: 17/149,898

(22) Filed: Jan. 15, 2021

(65) Prior Publication Data

US 2021/0151507 A1  May 20, 2021

Related U.S. Application Data

(63) Continuation-in-part of application No. 16/843,316, filed on Apr. 8, 2020, now Pat. No. 10,923,535, which is a continuation of application No. 16/156,568, filed on Oct. 10, 2018, now Pat. No. 10,651,240.

(60) Provisional application No. 62/570,735, filed on Oct. 11, 2017.

(51) Int. Cl.
| | |
|---|---|
| *H01L 27/30* | (2006.01) |
| *H01L 51/42* | (2006.01) |
| *H01L 51/00* | (2006.01) |
| *G01T 1/24* | (2006.01) |
| *G01T 1/02* | (2006.01) |

(52) U.S. Cl.
CPC ............ *H01L 27/308* (2013.01); *G01T 1/026* (2013.01); *G01T 1/24* (2013.01); *H01L 51/0035* (2013.01); *H01L 51/428* (2013.01); *H01L 51/0037* (2013.01)

(58) Field of Classification Search
CPC . H01L 27/308; H01L 51/428; H01L 51/0035; H01L 51/0037; G01T 1/24; G01T 1/026
See application file for complete search history.

(56) References Cited

U.S. PATENT DOCUMENTS

| | | | |
|---|---|---|---|
| 2016/0195573 A9* | 7/2016 | Murata | H01L 31/032 250/206 |
| 2016/0360138 A1* | 12/2016 | Meynants | H01L 27/14643 |

FOREIGN PATENT DOCUMENTS

| | | | | |
|---|---|---|---|---|
| CN | 106330105 A | * | 1/2017 | A61B 5/14552 |

* cited by examiner

*Primary Examiner* — Sitaramarao S Yechuri
(74) *Attorney, Agent, or Firm* — Stoyanov Law PLLC; Roy Chan

(57) ABSTRACT

An organic semiconductor detector for detecting radiation has an organic conducting active region, an output electrode and a field effect semiconductor device. The field effect semiconductor device has a biasing voltage electrode and a gate electrode. The organic conducting active region is connected on one side to the field effect semiconductor device and is connected on another side to the output electrode. The organic semiconductor detector has an option switching circuitry having a field effect semiconductor device and resistance.

16 Claims, 6 Drawing Sheets

SOLID STATE TISSUE EQUIVALENT DETECTOR WITH SWITCHING COMPENSATION

CROSS-REFERENCE TO RELATED APPLICATIONS

The present application is a Continuation-In-Part of U.S. patent application Ser. No. 16/843,316, filed on Apr. 8, 2020, which is a Continuation of U.S. patent application Ser. No. 16/156,568, filed Oct. 10, 2018 (now U.S. Pat. No. 10,651, 240, issued May 12, 2020), which claims priority to Provisional U.S. Patent Application Ser. No. 62/570,735, filed Oct. 11, 2017, and entitled "Solid State Tissue Equivalent Radiation Detector Improvement," the disclosures of which are incorporated herein by reference in their entirety.

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISC APPENDIX

Not Applicable

BACKGROUND OF THE INVENTION

This invention concerns a novel type of a Solid State Tissue Equivalent Detectors (SSTEDs) that combines semiconductor device construction principles and organic photoconductor technology. The detector is an improvement on the invention disclosed in U.S. Pat. Nos. 8,350,225 and 10,651,240, and U.S. patent application Ser. No. 16/843, 316, which are hereby incorporated by reference in their entirety, issued to the same inventor. The invention is a solid-state device that has an active region made of organic material; the entire device (with the exception of the electrical contacts) can be composed of organic material; it is small and lightweight; will operate at a relatively low voltage; and, will have a tissue equivalent response based on its constituent organic components.

The device is an improvement on the device presented in U.S. Pat. No. 8,350,225 with a modification introducing new electrodes and optional switching compensation circuitry. The new electrodes effectively make regions of the device, which are connected to the active region, act like Field Effect Transistors (FETs). The new electrodes act like gate regions of a standard FET and create field effect within regions of the device. Field effect refers to the modulation of the electrical conductivity of a material by the application of an external electric field. Thus, when the device is at a resting voltage and the FETs' resistance is very high, the active region is insulated preventing charge within the active region from draining. The new gate electrodes allow charges to be cleared from the active region when positive or negative voltage is applied to the gates thereby reducing the resistance of the FETs.

The switching and compensation electronic circuitry, hereinafter referred to as a "switching circuit" for short, may help among other things, to reset and clear the device, by, for example, draining residual electric charge from the active region, and/or maintaining the device output at a stable resting voltage.

BRIEF SUMMARY OF THE INVENTION

An embodiment of the present invention is an organic semiconductor detector for detecting radiation comprising an organic conducting active region, an output electrode and a field effect semiconductor device. The field effect semiconductor device comprises a biasing voltage electrode and a gate electrode. The organic conducting active region is connected on one side to the field effect semiconductor device and is connected on another side to the output electrode.

In another embodiment of the present invention, the field effect semiconductor device further comprises a channel region and an insulation region. The biasing voltage electrode is connected to the channel region. The insulation region electrically insulates the gate electrode and the channel region.

In yet another embodiment of the present invention, the channel region is a Pentacene channel region and the insulation region is a Parylene insulation region.

In another embodiment of the present invention, the organic conducting active region, the output electrode, the gate electrode and the biasing voltage electrode are made of PEDOT layers deposited on a PEN substrate.

In yet another embodiment of the present invention, a voltage at the output electrode is held at a constant level when the organic semiconductor detector is not being irradiated.

In another embodiment of the present invention, the constant level is 2 volts.

In yet another embodiment of the present invention, the organic conducting active region becomes positively electrically charged when the organic semiconductor detector is being irradiated with ionizing radiation. The voltage at the output electrode increases above the constant level when the organic conducting active region becomes positively electrically charged.

In another embodiment of the present invention, a negative voltage applied to the gate electrode when the organic conducting active region becomes positively electrically charged drains the positive electrical charge of the organic conducting active region and returns the voltage at the output electrode to the constant level.

In yet another embodiment of the present invention, the organic semiconductor detector for detecting radiation is configured as a dosimeter. The organic conducting active region becomes positively electrically charged when the organic semiconductor device is being irradiated with ionizing radiation. A gate voltage is applied to the gate electrode while the organic semiconductor detector is being irradiated. The gate voltage is determined so as to maintain the voltage at the output electrode at the constant level when the organic semiconductor detector is being irradiated. The gate voltage is representative of a dose of ionizing radiation received by the organic conducting active region.

In another embodiment of the present invention, an organic semiconductor detector for detecting radiation comprises an organic conducting active region, an output electrode, a first field effect semiconductor device and a second field effect semiconductor device. The first field effect semiconductor device comprises a first biasing voltage electrode and a first gate electrode. The second field effect semiconductor device comprises a second biasing voltage electrode and a second gate electrode. The organic conducting active region is connected to the first field effect semiconductor device and to the second field effect semiconductor device. The organic conducting active region is connected to the output electrode.

In yet another embodiment of the present invention, the first field effect semiconductor device further comprises a first channel region and a first insulation region and the second field effect semiconductor device further comprises a second channel region and a second insulation region. The first bias voltage electrode is connected to the first channel region and the second bias voltage electrode is connected to the second channel region. The first insulation region electrically insulates the first gate electrode and the first channel region and the second insulation region electrically insulates the second gate electrode and the second channel region.

In another embodiment of the present invention, the first channel region and the second channel region are Pentacene channel regions and the first insulation region and the second insulation region are Parylene insulation regions.

In yet another embodiment of the present invention, the organic conducting active region, the output electrode, the first gate electrode, the second gate electrode, and the first biasing voltage electrode, and the second biasing voltage electrode are made of PEDOT layers deposited on a PEN substrate.

In another embodiment of the present invention, a voltage at the output electrode is held at a constant level when the organic semiconductor detector is not being irradiated.

In yet another embodiment of the present invention, a negative voltage applied to the first gate electrode drains a positive electrical charge of the organic conducting active region when the organic conducting active region becomes positively electrically charged and returns the voltage at the output electrode to the constant level. A negative voltage applied to the second gate electrode drains a negative electrical charge of the organic conducting active region when the organic conducting active region becomes negatively electrically charged and returns the voltage at the output electrode to the constant level.

In another embodiment of the present invention, an organic semiconductor detector for detecting ionizing radiation comprises an active region made of conductive organic material; an output electrode made of conductive organic material; a first organic FET comprising a first source electrode, a first drain electrode, and a first gate electrode; a second organic FET comprising a second source electrode, a second drain electrode, and a second gate electrode; and, a third organic FET comprising a third source electrode, a third drain electrode, and a third gate electrode. The first gate electrode is connected to the second gate electrode. The active region is connected to the third source electrode. The third drain electrode is connected to the output electrode. The first drain electrode is connected to the output electrode. The second source electrode is connected to the output electrode.

In yet another embodiment of the present invention, an organic semiconductor detector for detecting ionizing radiation comprises an active region made of conductive organic material; an output electrode made of conductive organic material; a resistive element; a voltage follower op-amp circuit having an op-amp input and an op-amp output; a first organic FET comprising a first source electrode, a first drain electrode, and a first gate electrode; a second organic FET comprising a second source electrode, a second drain electrode, and a second gate electrode; and, a third organic FET comprising a third source electrode, a third drain electrode, and a third gate electrode. The first gate electrode is connected to the second gate electrode. The active region is connected to the third source electrode. The third drain electrode is connected to the output electrode. The first drain electrode is connected to the output electrode. The second source electrode is connected to the output electrode. The second drain electrode is connected to an electrical ground through the resistive element. The output electrode is connected to the op-amp input.

In another embodiment of the present invention, a method for using a device for detecting ionizing radiation as described above, comprises (i) resetting the device by applying a first negative voltage (Vg.float−) to the third gate electrode, and applying a second negative voltage (Vg.bias−) to the first gate electrode and the second gate electrode; and applying a resting voltage (Vbias) to the first source electrode; (ii) interrupting electrical flow between the active region and the output electrode by applying a positive voltage (Vg.float+) to the third gate electrode; (iii) accumulating an active region electrical charge indicative of the presence of ionizing radiation; (iv) outputting to the output electrode an output voltage (Vout) indicative of the active region electrical charge by applying negative voltage (Vg.float−) to the third gate electrode; and, (v) recording the output voltage (Vout).

BRIEF DESCRIPTION OF THE SEVERAL VIEWS OF THE DRAWING

The advantages and features of the present invention will be better understood as the following description is read in conjunction with the accompanying drawings, wherein.

Figure 1:
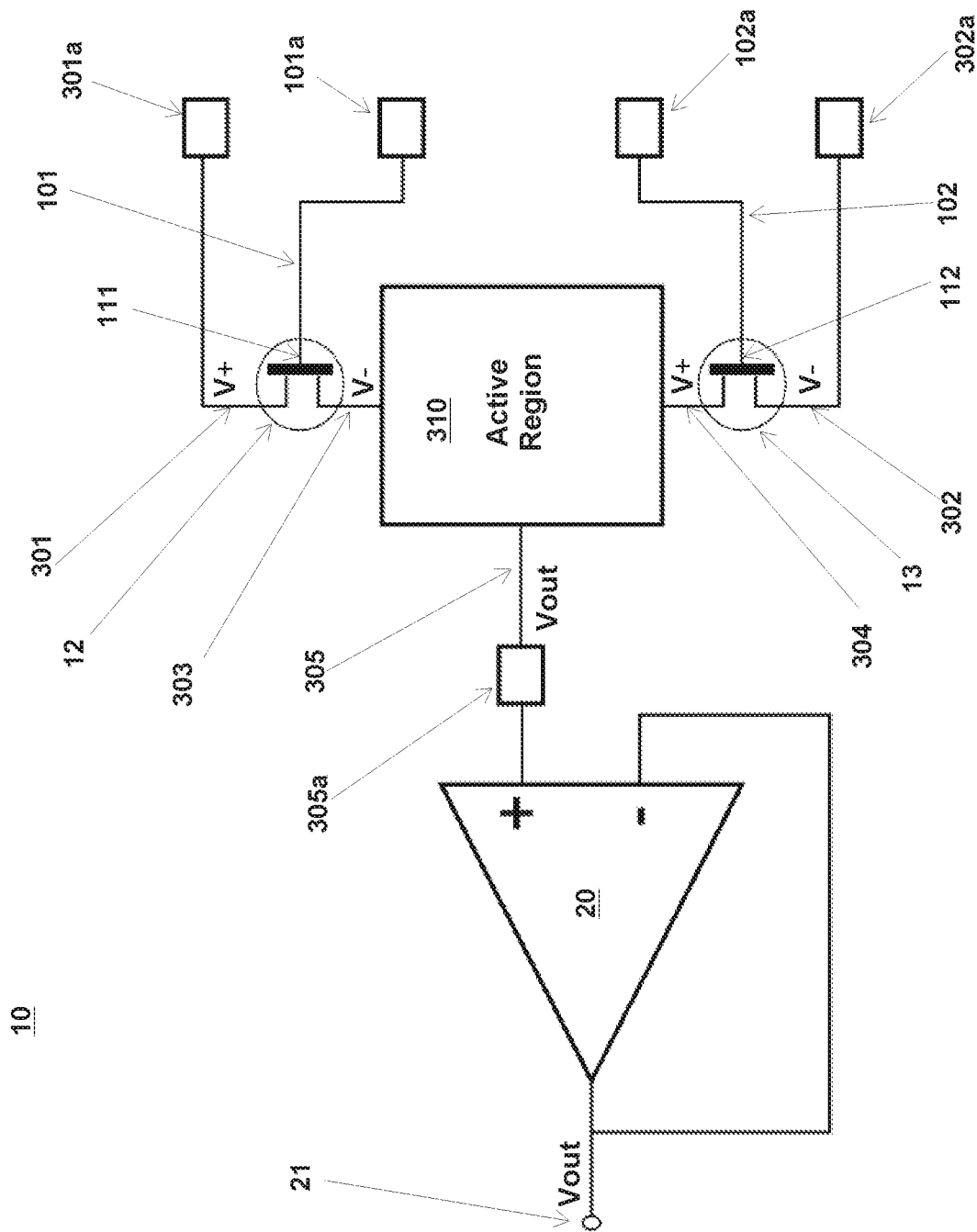
FIG. 1 is an illustration of an embodiment for the Solid State Tissue Equivalent Detector (SSTED).

For clarity purposes, all reference numerals may not be included in every figure.

DETAILED DESCRIPTION OF THE INVENTION

SSTEDs pursuant to the present invention are capable of measuring ionizing radiation using organic semiconductors. The devices are preferably fabricated on PEN (Polyethylene Naphthalate) substrates using the process described below. It is important to recognize that a large portion of the device which is exposed to radiation is constructed from organic material. This is a key feature, enabling the device to function as a tissue equivalent radiation detector. A material's radiation cross section is generally dependent on: (1) the atomic number of its constituent components, (2) the overall density of the material, and (3) the energy, character, characteristics, and/or quality of the incident ionizing radiation.

The atomic number of the constituent components of the materials used in the device is dictated by the chemical makeup of the material. The devices preferably are constructed from organic compounds to ensure that the atomic numbers and the relative proportions primarily match those of organic tissue. The atomic numbers of the constituent components for the device are selected so that the density of the active region is approximately the same density as the density of normal human tissue. The devices are primarily built from the same constituent components (e.g., Oxygen, Carbon, Hydrogen) as organic tissue with roughly the same density as material within a human cell. Consequently, from an ionizing radiation perspective, these devices have very similar radiation cross section as tissue, independent of the radiation energy and quality.

The SSTEDs pursuant to this invention respond appropriately to ionizing radiation of different qualities and energy. FIG. 1 shows a diagram of the structure of an embodiment of the SSTED. As illustrated in FIG. 1, the device 10 comprises two field effect semiconductor device regions 12 and 13 (for clarity referred to as FETs), each having a drain bias voltage electrode ("drain") (identified with V−) and a source bias voltage electrode ("source") (V+) and a gate electrode 111 or 112. The drain (V−) of FET 12 and the source (V+) of FET 13 are connected to an organic conducting active region ("Active Region") 310. The Gate 111 of FET 12 is connected via a gate connector 101 to an electrical contact 101a. The Gate 112 of FET 13 is connected via a gate connector 102 to an electrical contact 102a. The source (V+) of FET 12 is connected via a connector 301 to electrical contact 301a, and the drain (V−) of FET 13 is connected via a connector 302 to electrical contact 302a.

While FIG. 1 illustrates an embodiment with two field effect regions, the device can operate with a single field effect device region, for example FET 13. Adding a second field effect device region, e.g., FET 12, facilities in balancing the system, but is not required for operation, as will be understood by a person skilled in the art.

Also as illustrated on FIG. 1, the Active Region 310 is connected via a connector 305 to an electrical contact 305a. The electrical connector 305a is further connected to additional circuitry 20 comprising an Op-Amp with an output 21, and an input 22.

Figure 2:
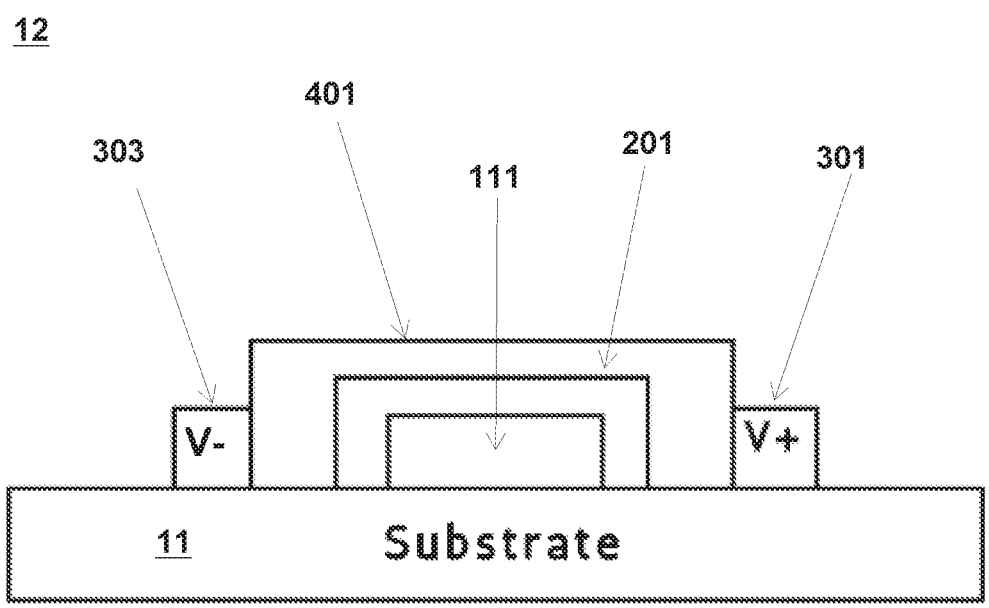
FIG. 2 is an illustration of a cross-section of an embodiment of the present invention.

FIG. 2 illustrates a cross section of FET 12. A cross section of FET 13 and FET 14 is the same and is not shown. FET 12 is formed on the substrate 11 by depositing layers of different materials, as described in more detail below. The FET 12 comprises a gate 111, insulation 201, channel 401, source electrode 301, and drain electrode 303. Insulation 201 insulates the gate electrode 111 and the gate connector 101 of the FET 12 from the rest of the FET structure so that the application of a gate voltage to the gate connector 101 (or electrical contact 101a) does not cause current to run within the rest of the FET structure, thereby creating the "field effect" in the FET structure.

The device 10 may be manufactured by printing or depositing layers of different materials on a substrate 11, preferably made of PEN. In this embodiment the first layer deposited on the substrate 11 is composed of a conducting polymer, preferably PEDOT (Poly(3,4-ethylenedioxythiophene)) and forms the gate electrodes 111, 112, the gate connectors, 101, 102, and electrical contacts 101a, 102a. The second layer is composed of a non-conducting polymer, preferably Parylene, and is deposited only in the region of the gate electrodes 111, 112 of the FET 12, 13. The second layer forms the insulation 201 (FIG. 2). The third layer deposited on the substrate is composed of a conducting polymer, preferably PEDOT. The third layer forms the Active Region 310, the output connection 305 and connector 305a. The third layer also forms the source 301, 304 and drain 302, 303 connectors of FETs 12, 13, and the electrical connectors 301a, 302a. The fourth layer is composed of high mobility organic semiconductor, preferably TIPS pentacene (6,13-Bis(triisopropylsilylethynyl) and forms the channel regions 401 of the FETs 12, 13. TIPS pentacene is a relatively high mobility organic semiconductor that is well suited for FET construction. It is also a reasonably good photoconductor, and this is exploited when the SSTEDs undergo testing of the device's structural integrity.

Within the device 10 a large portion of the third layer serves as the Active Region 310. The Active Region 310 has substantially larger volume (e.g., 50-200, or more, times larger) than any other feature or component within the device 10. This substantially larger volume can be achieved by increasing the area and/or thickness of the material forming Active region 310. The Active Region 310 becomes charged when the device is irradiated with ionizing radiation. The embodiment of device 10 illustrated in FIG. 1 includes a biasing amplifier 20. FETs 12, 13 are extremely high resistance when a positive or ground voltage is applied to the gate electrodes 111, 112, for example via the gate connectors, 101, 102, and contacts 101a, 102a.

Under these bias voltage conditions FETs 12, 13 act as resistors with resistances in the Giga Ohm range. The FETs 12, 13 therefore form a voltage divider and the voltage (Vout) at contact 305a measured between the points 303 and 304 where the FET pair is connected to the Active Region 310 can be held at a constant voltage at rest (e.g., when the device is not irradiated) ("resting voltage"). Assuming the device 10 comprises two FETs, and the FETs have equal resistances, the resting voltage can be approximately (V+−V−)/2. The voltages V+ and V− can also be adjusted so that at rest the Active Region 310 is held at different resting voltage, as measured at Vout at contact 305a. The value for the resting voltage is chosen to lie within the operating characteristics of the operational amplifier 20 used for the device 10, while taking into consideration the overall noise in the system, and the characteristics of the other components in the system. For example, if the max voltage of op-amp 20 is 4.5V, the resting voltage can be between 0V and 4.5V, but preferably will be closer to the middle of this range, around 2V. With other types of amplifiers the resting voltage can have different values.

The operational amplifier ("op-amp") 20 preferably is a femto-ampere input bias precision amplifier and is chosen so that it can sense small charge accumulations in the Active Region 310 without affecting the measurement. Such op-amps are typically used for electrometer measurements like the ones being described herein. For example, Texas Instruments LMP7721MA, or similar op-amps can be used. The op-amp 20 is configured as a voltage follower, isolating the Active Region 310 from downstream electronics. This isolation is required because the charge buildup in the Active Region 310 due to irradiation is small and any charge from other electronics leaking to the Active Region 310 will adversely affect the measurement. In the initial or unexposed state the Active Region 310 is nominally held at the resting voltage (as described above). The voltage follower configuration of op-amp 20 does not provide any gain, and as a result the voltage at contact 21 will nominally be the same as the voltage at contact 305a, in both contacts represented by Vout in FIG. 1. Because FETs 12, 13 are extremely high resistance (e.g., in the Giga Ohm range) effectively insulating the Active Region 310, the Active Region 310 essentially is held at the resting voltage but is "free standing." By "free standing" it is meant that the Active Region 310 is primarily connected to the op-amp 20 and isolated from everything else.

When the device 10 is irradiated with ionizing radiation the Active Region 310 becomes ionized as electrons are driven out of the Active Region 310. The Active Region 310 thus becomes more positively charged and the value of Vout at connector 305, and at connector 21 will increase above the resting voltage. Because the input impedance of the op-amp 20 and the resistance of the FETs 12, 13 are very high, there is very insignificant conduction path to bring the voltage in the Active Region 310 back to the resting voltage. The insignificant conduction through the FET 12, 13 will drain the charge of the Active Region 310 (or equalize the charge) over a long period of time. To speed up the draining of the charge from the Active Region 310 a negative voltage can be applied to the gate electrode 112 of FET 13. Applying negative voltage to gate connector 102, which is connected to gate electrode 112, will reduce the resistance of FET 13 and allow conduction through FET 13 to drain the positive charge from the Active Region 310 and restore the Active Region 310 to the resting voltage.

In a situation when the Active Region 310 is negatively charged, it can be returned to resting voltage by applying negative voltage to gate electrode 111 of FET 12. While the device 10 is at rest positive voltage may also be applied to gate electrodes 111 and 112 to increase the charge and increase the resistance of FETs 12, 13. Control of the gate is managed by a separate control board that in this embodiment is Arduino based, but maybe any other suitable electronics control board known in the art.

Figure 3:
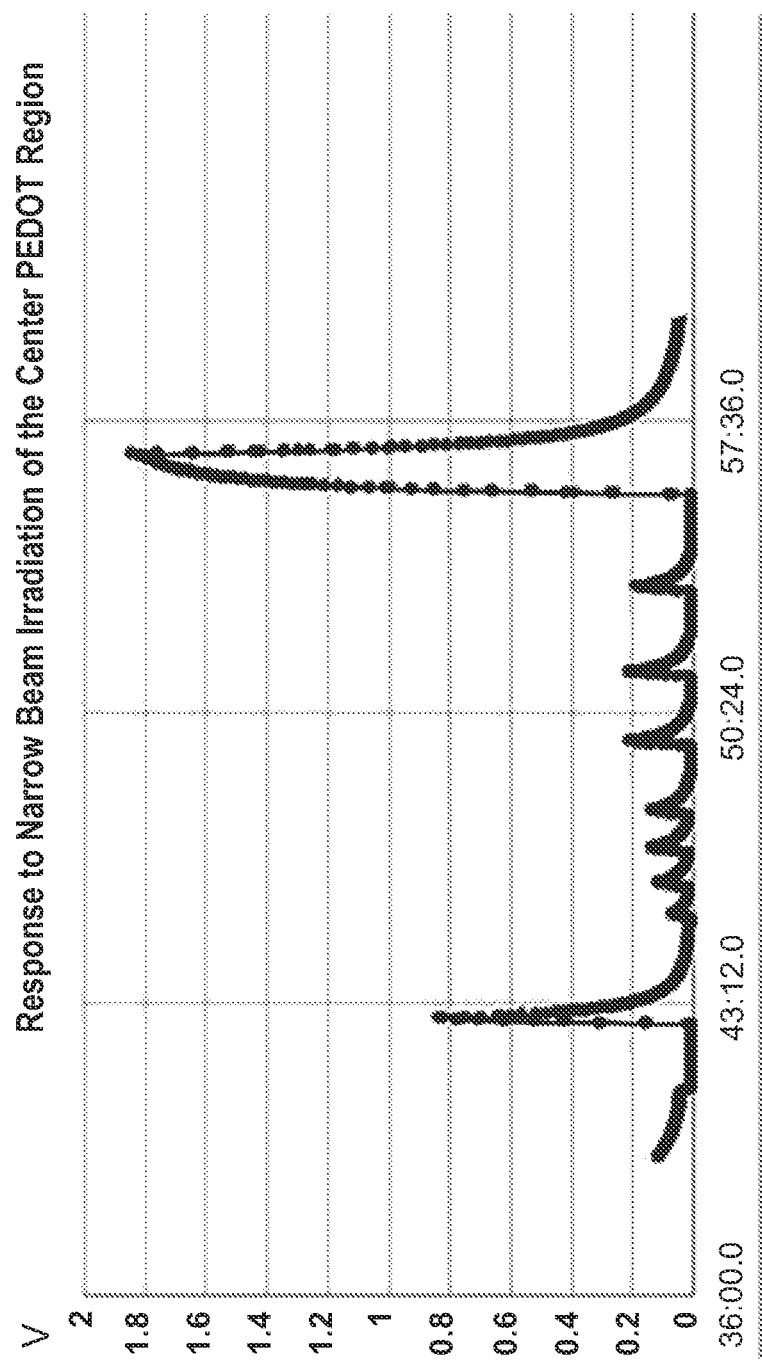
FIG. 3 is a graphical illustration of the response of an embodiment of the present invention to microbeam radiation.

FIG. 3 shows a test response of an SSTED embodiment of this invention to a 300 micrometer wide beam of 40 kV X-rays irradiating the center of the Active Region 310. For the test the beam was produced by X-ray Diffraction (XRD) crystallography apparatus. The X-ray tube voltage and current can be adjusted, and the exposure time is always 5 seconds in the figure. The "0" value of the Y axis represents resting voltage, and the Y-axis shows volts above the resting voltage measured at Vout, and the X-axis shows time in minutes and seconds. Each peak on the graph of FIG. 3 coincides with X-Ray exposure of the Active Region 310 of device 10. FIG. 3 shows nine peaks corresponding to nine periods of X-Ray exposure of the Active Region 310. As FIG. 3 illustrates, at each peak different maximum voltages above resting voltage were registered, corresponding to different intensities of X-Ray radiation.

The tail after each peak on FIG. 3 indicates the time it takes to bring the Active Region 310 back to resting voltage by applying voltage to the gate electrode 112 of FET 13. In this experiment a small bias voltage was applied to gate electrode 112 via gate connector 102 and contact 102a. A different implementation of a biasing mechanism would be to hold the output voltage Vout constant by applying a feedback voltage from output connector 21 or 305a to gate connector 102 and varying the voltage applied at gate connector 102 depending on the value of the feedback voltage. The voltage thus applied at gate electrode 112 (e.g., via gate connector 102, contact 102a) to maintain a constant Vout would be representative of the intensity of the ionizing radiation and can be used as an effective dosimeter output. The SSTEDs have been probed with the 300 micrometers (μm) microbeam across the entire surface of the device. This is an extremely important measurement if the device is to be truly tissue equivalent. When materials are exposed to ionizing radiation, they naturally become charged. It is necessary for us to only measure the contribution from organic regions of the device. The contributions from other regions of the device are found to negligible, proving that the response to ionizing radiation will mainly arise from charge generation within the Active Region 310.

Figure 4:
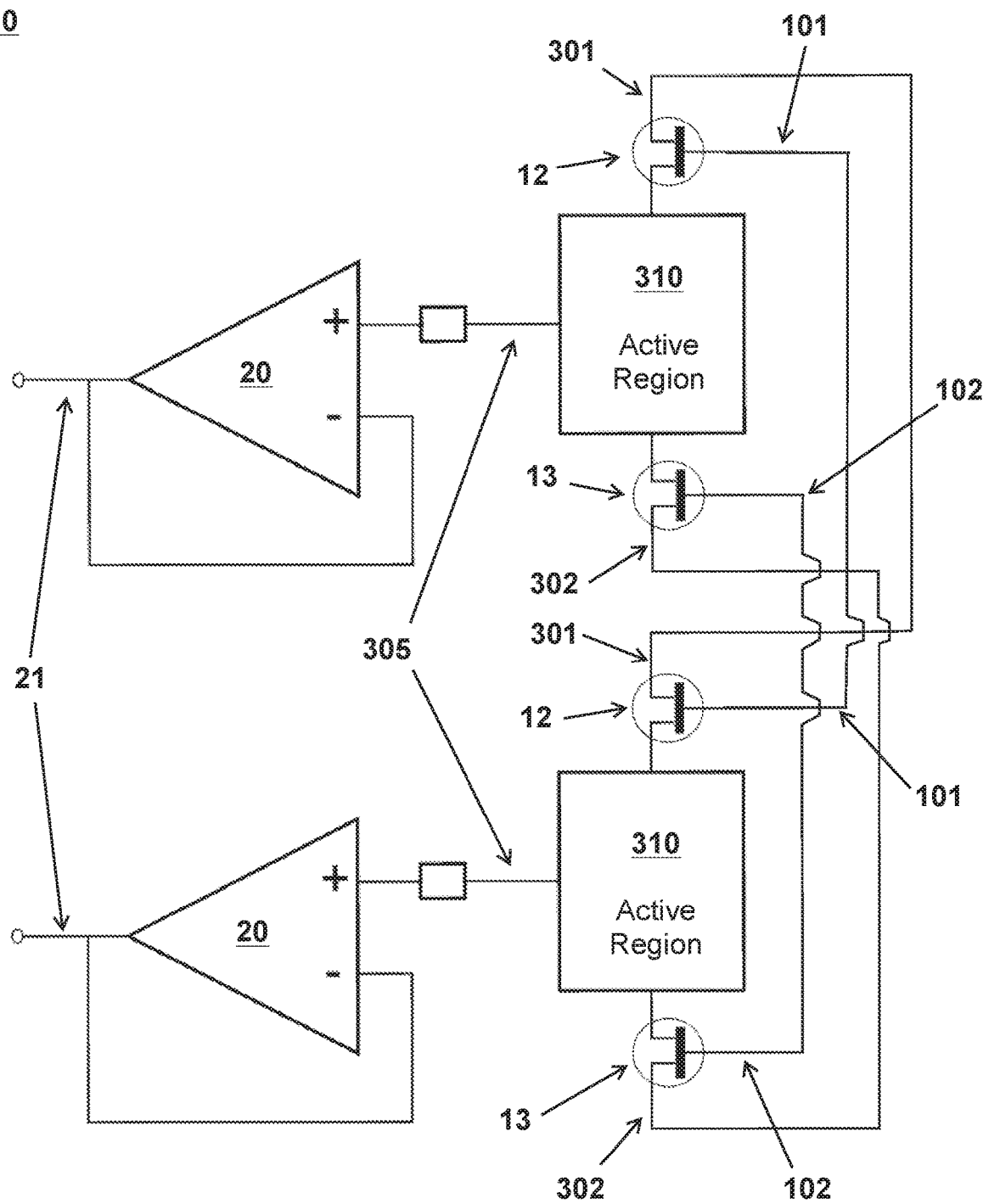
FIG. 4 is illustration of an embodiment for the Solid State Tissue Equivalent Detector (SSTED) comprising two active regions.
Figure 5:
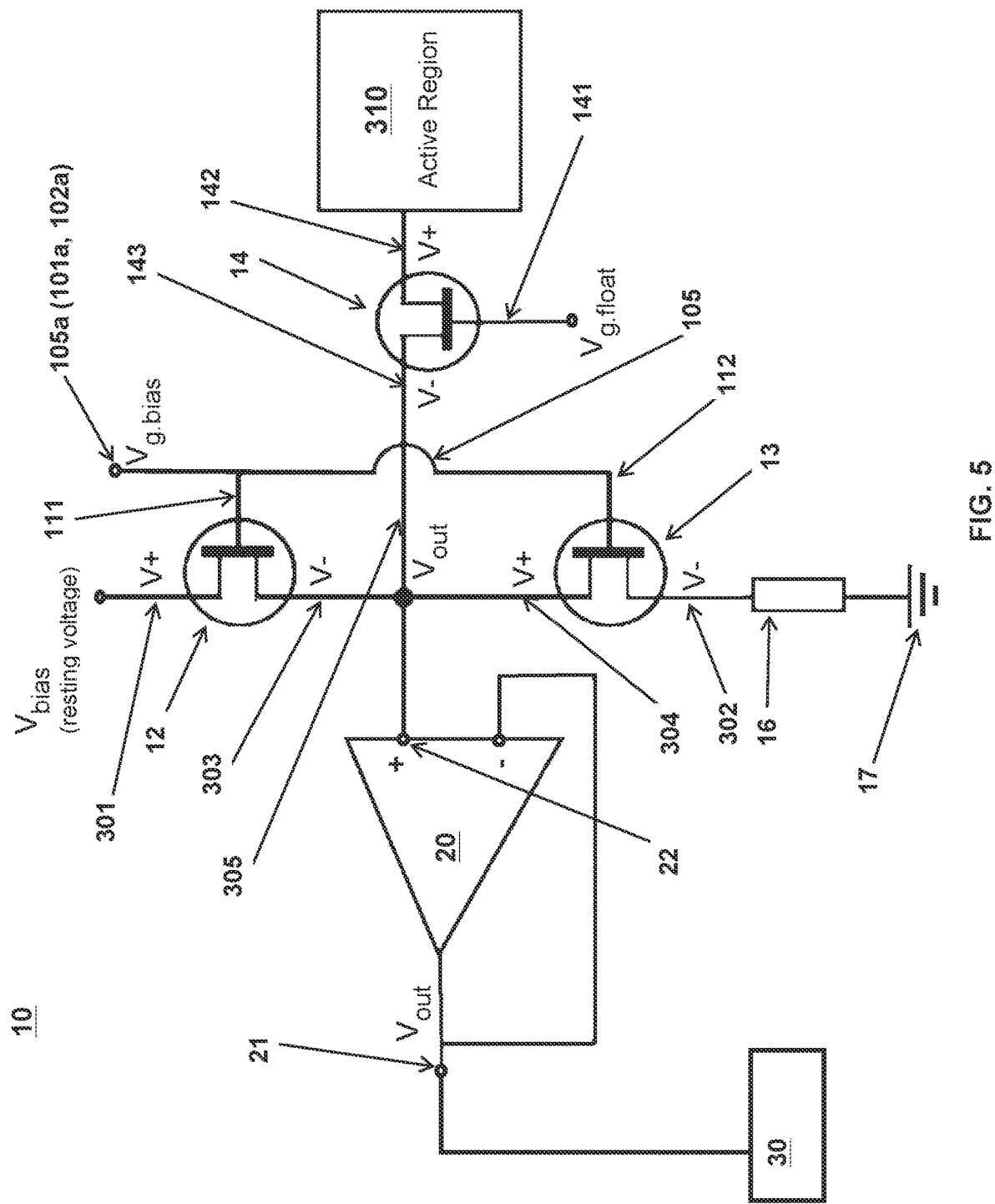
FIG. 5 is an illustration of an embodiment for the Solid-State Tissue Equivalent Detector (SSTED) comprising switching compensation circuitry.

In another embodiment, illustrated in FIG. 5, device 10 comprises switching circuitry that may facilitate and speed-up the resetting and clearing of device 10 between readings, for example by bringing the voltage at the active region 310 and output 21 to the resting voltage, and by draining residual charge from active region 310. The switching circuitry my comprise a FET 14 (e.g., a field effect semiconductor device region as explained, above), a resistance 16, an electrical connection 105 between gate electrodes 111 and 112. Either the drain (V−) or the source (V+) electrode of FET 14 may be connected to Active Region 310, while the other of the drain or source electrodes (the electrode not connected to the Active Region 310), may be connected to output connection 305. FIG. 5 illustrates an embodiment in which the source electrode (V+) 142 of FET 14 is connected to the Active region 310, and the drain electrode (V−) 143 is connected to output connection 305, but as explained previously, the connections to the source 142 and drain 143 electrodes can be swapped. Resistance 16, connected to ground 17, may be used to prevent short circuit when. The Resistance 16 preferably is in the range of 10 Kilo Ohm to 1 Mega Ohm. When Op-Amp 20 is used, Resistance 16 should be several orders of magnitude (e.g., at least five orders of magnitude) lower than the input impedance of the of the Op-Amp 20.). When Op-Amp 20 is being utilized in the voltage follower configuration described above, the output connection 305 may be connected to the Op-Amp input 22, as illustrated in FIGS. 1, 4 and 5, and the Op-Amp output 21 will have the same voltage Vout as output connection 305.

Voltage, indicated as Vg.float on FIG. 5, may be applied to gate electrode 141 of FET 14. When voltage Vg.float is positive voltage the resistance of FET 14 is in the Giga Ohm range, effectively creating an open circuit and causing the Active Region 310 to "float," by effectively disrupting the electrical connections between the Active Region 310 and output connection 305, and between the Active Region 310 and any other electronics within device 10. While the Active Region 310 is "floating" there is no path for any electrical charge to quickly drain from the active region, and electrical charge created within the active region 310, for example from incident ionizing radiation, will build up within the Active Region 310, resulting in the Active Region having an electrical charge (or voltage) higher than the resting voltage of the active region prior to floating the active region 310. In the absence of incident radiation, while the Active Region 310 is "floating," its charge (i.e., voltage) will remain substantially the same as its resting voltage.

When negative voltage, Vg.float is applied to gate electrode 141 the resistance of FET 14 drops providing an electrical connection between Active Region 310 and output connection 305, resulting in output connection 305 and output 21 having voltage Vout that is the same as the voltage at Active Region 310, as shown in FIG. 5.

When negative voltage Vg.bias is applied to gate electrodes 111 and 112, as explained above the resistance of FETs 12 and 13 drops effectively "closing" the electrical circuit and enabling an electrical connection between source electrode 301, output connection 305 and Resistance 16, resulting in the voltage at output 21 (Vout), at output connection 305 (Vout), and across resistance 16 to be equal to the voltage at source electrode 301 (Vbias). If under these conditions a resting voltage Vbias is applied to source electrode 301, Vout will become equal to the Vbias resting voltage.

When positive voltage Vg.bias is applied to gate connectors 111 and 112, the resistance of FETs 12 and 13 substantially increases effectively "opening" the electrical circuit and interrupting the electrical connection, and electrical flow, between source electrode 301 and output connection 305, and between output connection 305 and resistance 16.

Figure 6:
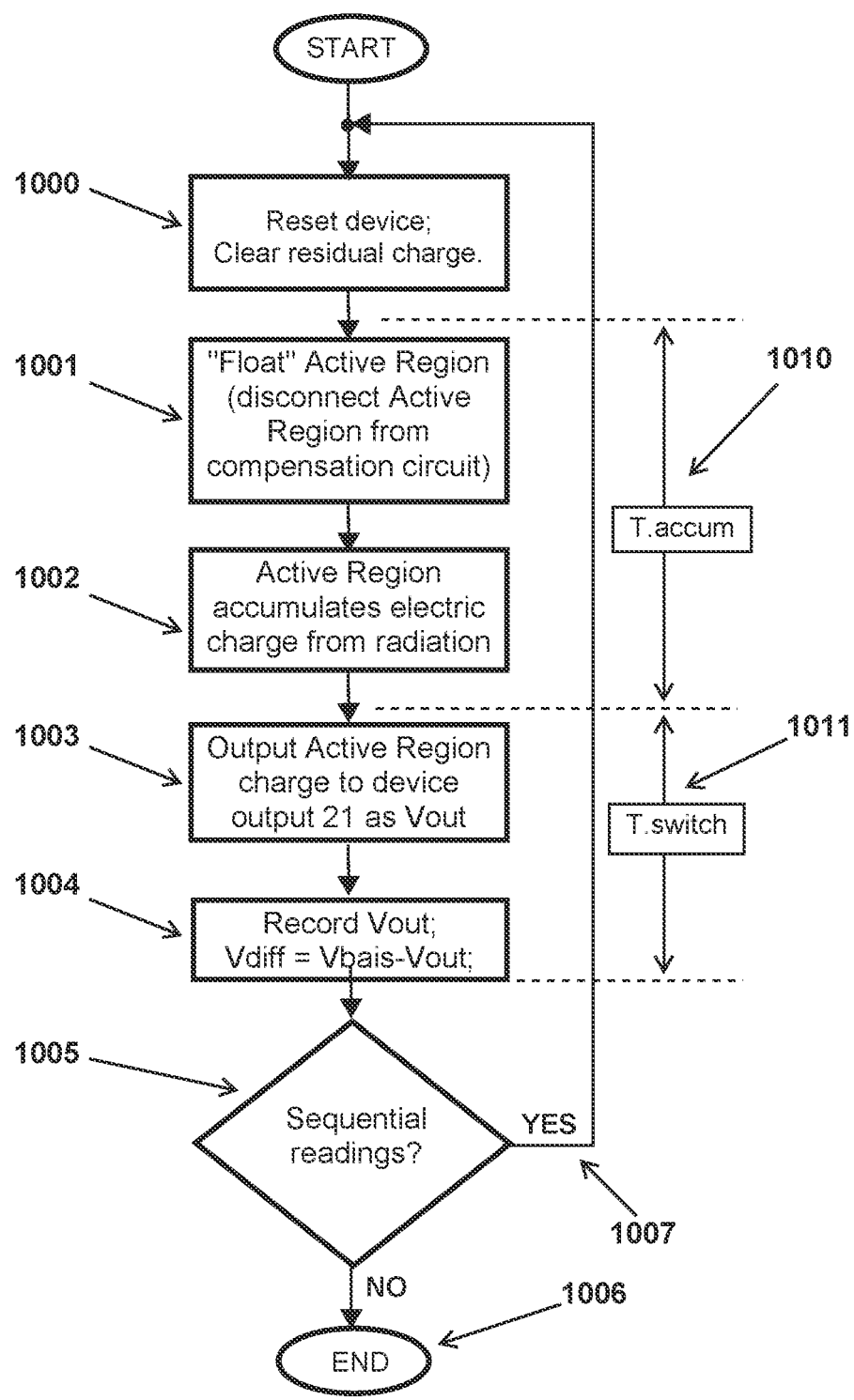
FIG. 6 is chart illustrating the operation of an embodiment of the Solid-State Tissue Equivalent Detector (SSTED) comprising switching compensation circuitry.

The embodiment illustrated in FIG. 5 may operate to detect or read the presence and/or energy of incident ionizing radiation as illustrated in FIG. 6.

As illustrated in FIG. 6, in step 1000, device 10 can be cleared of residual electrical charge and reset to the resting voltage. In step 1000, a negative voltage Vg.float is applied to gate electrode 141, and negative Vg.bias is applied to gate electrodes 111 and 112. This effectively closes the electrical connections through FETs 12, 13, and 14, allowing electrical charge from active region 310 to drain, and making the resting voltage (Vbias) of source electrode 301 equal to Vout (at output connection 305 and output 21), and equal to the voltage of Active region 310.

In step 1001 active region 310 is "floated" by applying positive voltage Vg.float to gate electrode 141 and interrupting the electrical path, and electrical flow, through FET 14 between Active Region 310 and output connection 305. While the Active Region 310 is floating, negative voltage Vg.bias can be applied to gate electrodes 111 and 112 to maintain an electrical connection through FETs 12 and 13 and maintaining output connection 305 and output 21 at the resting voltage Vbias.

In step 1002, the active region 310 is "accumulating" electrical charge indicative of the presence of ionizing radiation while the Active Region 310 is "floating," disconnected from the output connection 305. By "accumulating" in step 1002 it meant that the electrical charge of the active region 310 will increase above the resting voltage if ionizing radiation is present and the electrical charge of the active region 310 will remain substantially the same as the resting voltage if radiation is not present. While the Active Region 310 is floating and accumulating in step 1002, negative voltage Vg.bias can be applied to gate electrodes 111 and 112 to maintain the voltage, Vout, at output connection 305 and output 21 at the resting voltage, Vbias applied to source electrode 301.

In step 1003, positive voltage Vg.bias is applied to gate electrode 111 and 112 to interrupt the electrical connection through FETs 12 and 13 between source electrode 301 and output connector 305. In step 1003 negative voltage Vg.float is applied to gate electrode 141 electrically connecting the Active Region 310 and output connection 305 through FET 14. When Active region 310 is connected to output connection 305, while output connection 305 is disconnected from Source Electrode 301 and from resistance 16 Vout becomes equal to the voltage of the Active Region 310, which is indicative of the presence or absence, of incident ionizing radiation and may be proportional to the dose of the incident ionizing radiation if any.

In step 1004, Vout and/or the difference between Vout and resting voltage Vbias may be recorded and analyzed using, for example, a microprocessor based devices and/or software. If Vout, which in steps 1003 and 1004 is equal to the voltage of Active region 310, is higher than the resting voltage Vbias that would indicate the presence of radiation, and the difference between Vout and the resting voltage may be used to quantify the amount and/or energy of the radiation.

In step 1005 the process may be configured to continue sampling (perform multiple sequential readings) for radiation. If continued sampling is configured, loop 1007 restarts the sampling process with step 1000, otherwise the process ends at step 1006.

The inventor discovered that the switching circuit, comprising FET 14 and resistance 16 connected to ground 17, is particularly beneficial in obtaining voltage output readings Vout, indicative of dose and dose rate of the incident radiation, and in allowing reliable continuous repeated readings (e.g., continuous sampling) of incident radiation. The switching circuit allows, for example in step 1000, prior to each reading the device to be cleared of any residual charge, and reset to the resting voltage, e.g., Vbias. Accordingly, output voltage Vout will be at substantially the resting voltage Vbias prior to each reading (e.g., in step 1002) and Vout can be maintained at the resting voltage while the active region 310 is accumulating electrical charge from incident ionizing radiation. At the end of each accumulation step (e.g., step 1002), the voltage Vout at output connection 305 and/or output 21 will be higher than the resting voltage Vbias if incident radiation is present and will be substantially the same as the resting voltage in the absence of incident radiation. Because the invention allows each reading to begin at the same resting voltage Vbias and to maintain Vout at the resting voltage Vbias during each reading, at the end of each reading the voltage Vout (e.g., step 1003) is indicative of the dose of incident radiation during the reading. For example, Vout or the voltage difference Vdiff between Vbias and Vout, can be proportional to the dose of incident ionizing radiation during steps 1001 and 1002. If in step 1004 Vdiff is calculated, where Vdiff=Vout−Vbias, a larger Vdiff will correspond to a larger dose of radiation incident on the device 10 and active region 310 while the active region was floating (step 1001) and accumulating electrical charge (step 1002). A recording system 30 that may be used for example in step 1004 may be calibrated so that different voltage values of Vdiff, or Vout if the resting voltage Vbias is kept constant and used as a reference, correspond to different doses or radiation incident on device 10, and specifically on active region 310, during steps 1001 and 1002. Through testing and calibration the recording system 30 may be configured to ignore (or filter out) Vdiff below a certain voltage that represent small variations of electrical charge not attributable to radiation, but are from other sources, such as electrical noise, leaks, or others.

When performing sequential readings, the switching circuit also enables the device 10 to reliably indicate the accumulated dose of incident radiation over a time period, and the rate of change of incident radiation. For example, a plurality of sequential readings can be performed during a time period, and a radiation dose can be determined (based on Vout or Vdiff) for each sequential reading. The sum of all radiation doses from all of the plurality of sequential readings will then indicate the combined dose of radiation incident on device 10 during the time period to perform the plurality of sequential readings. Performing multiple sequential readings over a time period instead of a single reading at the end of the time period can prevent the Active Region 310 from saturating (e.g., reaching the maximum electrical charge the active region can hold) if it is exposed to incident radiation for a prolonged time. If the Active Region 310 saturates, dose of incident radiation after the time of saturation will not be measured. Device 10 may be placed on a human, animal, plants, food, goods, or can be placed on any entity or in any location where it is desirable to determine the presence or dose of ionizing radiation. Because device 10 is organic, and can be a tissue equivalent device, the dose of radiation received on active region 310 during any period of time, will be indicative of radiation received by the entity on which, or location where, device 10 is placed. The recording device can be configured to issue alarms and/or alerts when the amount of accumulated radiation approaches or exceeds certain predetermined radiation doses depending on the conditions and purpose for using device 10.

In a different example, the switching circuit is beneficial to determining the dose rate of incident radiation and the change of incident radiation. FIG. 6 illustrates the electric charge accumulation time 1010 (T.accum) as the combined duration of steps 1001 and 1002. More broadly, T.accum 1010 can be described as the length of time during which the active region 301 is floating thus enabling electrical charge to accumulate in the active region 310 if device 10 is irradiated with ionizing radiation. The dose rate, or radiation dose over time, for each reading can be determined by dividing the dose during that reading by T.accum. The rate of change of incident radiation can be obtained by configuring device 10 to perform a plurality of sequential readings where T.accum is the same for each of the plurality of sequential readings. After each sequential reading the output voltage Vout of device 10 can be output and recorded (e.g., steps 1003 and 1004), and the dose and dose rate of incident radiation can be determined for each reading. In this example, because the accumulation time of electrical charge from incident radiation, T.accum, is the same for each sequential reading, the value of Vdiff for each sequential reading, and the changes of Vdiff between sequential readings, will be indicative of the rate of change the radiation incident on the active region 310 during each reading. If, for example the dose or dose rate increases with each reading, the incident radiation is increasing. A recording system 30 can analyze, record, graph, etc., each dose, dose rate, and the rate of change of the dose and dose rate over time based on multiple sequential readings. The system 30 could be configured to generate an alarm if the incident radiation is increasing faster than a predetermined rate.

During steps 1003 and 1004, the output and recording steps, of the process illustrated in FIG. 6 and described above, the electronics of device 10 other than Active region 310, such as the Op-amp 20 and others, may contribute additional electrical charge to Vout if the switching time 1011 (T.switch) to perform steps 1003 and 1004 is of similar order of magnitude as the accumulation time 1010 (T.accum). In addition, while performing sequential readings, the calculated combined dose (or amount) of radiation received by device 10 during the sequential readings will not be accurate if T.switch (while the active region is not accumulating radiation charge) is comparable to T.accum. To increase accuracy and reduce additional charge accumulation and potential reading errors, the switching time T.switch 1011 (e.g., time for steps 1003 and 1004) should be kept substantially shorter than accumulation time T.accum 1010. Preferably T.accum 1010 should be at least one order of magnitude larger, and preferably at least two orders of magnitude (e.g., 100 times) larger than the switching time T.switch 1011. As an example, in a preferred embodiment, T.accum 1010 could be approximately 100 milliseconds, but may range from 10 milliseconds to several minutes.

It will be understood by those skilled in the art that when the FETs are symmetric the source (V+) and drain (V−) electrodes are interchangeable and references herein to source (V+) and drain (V−) electrodes are solely for illustration. Also, as will be understood by those skilled in the art references to voltage herein refer to voltage measured with reference to ground (e.g., indicated with numeral 17).

Device 10 on an integrated circuit board can be fabricated on a PEN substrate with an organic ground plate, and an organic insulating layer on top of the ground plate. Each circuit of device 10 is built on top of the ground plate and the insulating layer. Any non-mobile charges that might be generated within the PEN substrate will not contribute to the device measurements because any field such charges may produce will be isolated by the ground plane.

The device 10, with or without op-amp 20, can be encapsulated (or packaged) in resin, epoxy, or other organic dielectric material known to a person of ordinary skill in the art to help reduce or eliminate electric issues, such as static charge, current leakage, and others. To allow detection and/or recording of Vout when device 10 is encapsulated, a portion of output connection 305, or of Op-Amp output 21 may be left exposed as an output electrode.

Device 10 can be fabricated on an integrated circuit board, using the photolithography process summarized below. Initially, four sets of lithography masks are designed and fabricated using known techniques. The PEN substrate is prepared and a 100 nm layer of PEDOT is applied to the entire PEN surface. This PEDOT layer will act as the ground plane for all devices. The ground plane is completely coated with a 1-2 micron layer of polyimide or Parylene. A second, layer of PEDOT is applied. This second PEDOT layer will be patterned by applying on top of it Photo-resist specifically designed for use with PEDOT. The Photo-resist is exposed with a FET Gate Pattern Mask and the Photo-resist is developed. The second PEDOT layer is etched away leaving the initial gate structure and bonding pads for the FETs. A Parylene layer about 500 nm thick is applied on top of the gate structures. A third PEDOT layer of 100 nm is spun on top of the Parylene. The third PEDOT layer is patterned using a similar photolithography process to create the FET source/drain connections and the "wiring" connections for the device. The PEDOT in the active region 310 is made substantially thicker using two different methods, including another photolithographic process, and an ink-jet type printing process. Using these methods Active regions of 1, 2, and 5 microns can be produced. The PEDOT and Parylene at the FET gate bonding pads is etched back. The channels for the FETs are formed by printing 100-500 nm of TIPS pentacene, or by evaporating 100-500 nm of DNTT through a shadow mask to the appropriate regions. The PEN wafer is diced.

After the initial fabrication summarized above is complete, each device on the circuit board can be examined using optical and AFM (Atomic Force Microscopy) microscope to characterize the quality of all produced devices. The electrical properties of the devices can also be characterized to ensure that device impedance is within the expected range.

While the invention has been described with reference to exemplary embodiments, it will be understood by those skilled in the art that various changes, omissions, and/or additions may be made and equivalents may be substituted for elements thereof without departing from the spirit and scope of the invention. In addition, many modifications may be made to adapt a particular situation or material to the teachings of the invention without departing from the scope thereof. Therefore, it is intended that the invention not be limited to the particular embodiments disclosed as the best mode contemplated for carrying out this invention, but that the invention will include all embodiments falling within the scope of the appended claims. Moreover, unless specifically stated any use of the terms first, second, etc. do not denote any order or importance, but rather the terms first, second, etc. are used to distinguish one element from another.

I claim:

1. An organic semiconductor detector for detecting ionizing radiation comprising:
   an active region made of conductive organic material;
   an output electrode made of conductive organic material;
   a first organic FET comprising a first source electrode, a first drain electrode, and a first gate electrode;
   a second organic FET comprising a second source electrode, a second drain electrode, and a second gate electrode; and,
   a third organic FET comprising a third source electrode, a third drain electrode, and a third gate electrode;
   wherein the first gate electrode is connected to the second gate electrode;
   wherein the active region is connected to the third source electrode;
   wherein the third drain electrode is connected to the output electrode;
   wherein the first drain electrode is connected to the output electrode; and,
   wherein the second source electrode is connected to the output electrode.

2. The organic semiconductor detector of claim 1, wherein an output electrode voltage and a first source electrode voltage are equivalent when a negative voltage is applied to the first gate electrode and the second gate electrode; and,
   wherein the output electrode voltage and an active region voltage are equivalent when a negative voltage is applied to the third gate electrode.

3. The organic semiconductor detector of claim 2, wherein the active region has an accumulated electric charge from incident ionizing radiation when a positive voltage is applied to the third gate electrode.

4. The organic semiconductor detector of claim 3, wherein the output electrode voltage is indicative of the accumulated electric charge from incident ionizing radiation when a positive voltage is applied to the first gate electrode and the second gate electrode and a negative voltage is applied to the third gate electrode.

5. The organic semiconductor detector of claim 1, wherein the active region, the output electrode, the first organic FET, the second organic FET, and the third organic FET are encapsulated in an insulating organic material.

6. An organic semiconductor detector for detecting ionizing radiation comprising:
   an active region made of conductive organic material;
   an output electrode made of conductive organic material;
   a resistive element;
   a voltage follower op-amp circuit having an op-amp input and an op-amp output;
   a first organic FET comprising a first source electrode, a first drain electrode, and a first gate electrode;
   a second organic FET comprising a second source electrode, a second drain electrode, and a second gate electrode; and,
   a third organic FET comprising a third source electrode, a third drain electrode, and a third gate electrode;
   wherein the first gate electrode is connected to the second gate electrode;
   wherein the active region is connected to the third source electrode;
   wherein the third drain electrode is connected to the output electrode;
   wherein the first drain electrode is connected to the output electrode;
   wherein the second source electrode is connected to the output electrode;
   wherein the second drain electrode is connected to an electrical ground through the resistive element; and,
   wherein the output electrode is connected to the op-amp input.

7. The organic semiconductor detector of claim 6, wherein an op-amp output voltage and a first source electrode voltage are equivalent when a negative voltage is applied to the first gate electrode and the second gate electrode; and,
   wherein the op-amp output voltage and an active region voltage are equivalent when a negative voltage is applied to the third gate electrode.

8. The organic semiconductor detector of claim 7, wherein the active region has an accumulated electric charge from incident ionizing radiation when a positive voltage is applied to the third gate electrode.

9. The organic semiconductor detector of claim 8, wherein the op-amp output voltage is indicative of the accumulated electric charge from incident ionizing radiation when a positive voltage is applied to the first gate electrode and the second gate electrode and a negative voltage is applied to the third gate electrode.

10. The organic semiconductor detector of claim 7, wherein the active region, the output electrode, the voltage follower op-amp circuit, the first organic FET, the second organic FET, and the third organic FET are encapsulated in an insulating organic material.

11. A method for using a device for detecting ionizing radiation,
    wherein the device is an organic semiconductor detector comprising:
    an active region made of conductive organic material;
    an output electrode made of conductive organic material;
    a first organic FET comprising a first source electrode, a first drain electrode, and a first gate electrode;
    a second organic FET comprising a second source electrode, a second drain electrode, and a second gate electrode; and,
    a third organic FET comprising a third source electrode, a third drain electrode, and a third gate electrode;
    wherein the first gate electrode is connected to the second gate electrode;
    wherein the active region is connected to the third source electrode;
    wherein the third drain electrode is connected to the output electrode;
    wherein the first drain electrode is connected to the output electrode; and,
    wherein the second source electrode is connected to the output electrode; and,
    wherein the method comprises:
    (i) resetting the device by applying a first negative voltage (Vg.float−) to the third gate electrode, and applying a second negative voltage (Vg.bias−) to the first gate electrode and the second gate electrode; and applying a resting voltage (Vbias) to the first source electrode;
    (ii) interrupting electrical flow between the active region and the output electrode by applying a positive voltage (Vg.float+) to the third gate electrode;
    (iii) accumulating an active region electrical charge indicative of the presence of ionizing radiation;
    (iv) outputting to the output electrode an output voltage (Vout) indicative of the active region electrical charge by applying negative voltage (Vg.float−) to the third gate electrode; and,
    (v) recording the output voltage (Vout).

12. The method of claim 11, further comprising:

(vi) maintaining the output electrode at the resting voltage (Vbias) by applying a third negative voltage (Vg.bias−) to the first gate electrode and the second gate electrode and applying the resting voltage (Vbias) to the first source electrode.

13. The method of claim 12, further comprising:

(vii) applying a positive voltage (Vg.bias+) to the first gate electrode and the second gate electrode; and, (viii) equalizing the output voltage (Vout) and the active region electrical charge.

14. The method of claim 11, wherein steps (i), (ii), (iii), (iv) and (v) are repeated.

15. The method of claim 11, wherein:

step (ii) has a first duration;

step (iii) has a second duration;

step (iv) has a third duration; and, step (v) has a fourth duration;

wherein the first duration forms a first portion of a charge accumulation time period and the second duration forms a second portion of the charge accumulation time period;

wherein the third duration forms a first portion of a switching time period and the fourth duration forms a second portion of the switching time period; and, wherein the charge accumulation time period is one or more orders of magnitude longer than the switching time period.

16. The method of claim 15 wherein steps (i), (ii), (iii), (iv) and (v) are repeated one or more times.

* * * * *